United States Patent
Vera Villarroel et al.

(10) Patent No.: US 9,634,611 B1
(45) Date of Patent: Apr. 25, 2017

(54) METHOD FOR IMPROVING STABLE FREQUENCY RESPONSE OF VARIABLE GAIN AMPLIFIER

(71) Applicant: INPHI CORPORATION, Santa Clara, CA (US)

(72) Inventors: Ariel Leonardo Vera Villarroel, Porter Ranch, CA (US); Subramaniam Shankar, Thousand Oaks, CA (US); Steffen O. Nielsen, Newbury Park, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/929,809

(22) Filed: Nov. 2, 2015

(51) Int. Cl.
  *H03F 3/45* (2006.01)
  *H03F 1/02* (2006.01)
  *H03G 3/30* (2006.01)
  *H03F 3/19* (2006.01)

(52) U.S. Cl.
  CPC .............. *H03F 1/0205* (2013.01); *H03F 3/19* (2013.01); *H03F 3/45076* (2013.01); *H03G 3/3036* (2013.01); *H03F 2200/451* (2013.01); *H03F 2203/45156* (2013.01)

(58) Field of Classification Search
  CPC ....... H03F 3/45; H03G 3/3036; H03G 3/3042
  USPC .......................................... 330/254; 327/359
  See application file for complete search history.

(56) References Cited

U.S. PATENT DOCUMENTS 8,198,933 B2 * 6/2012 Saverio ................ H03D 7/1425
                                                        327/355

* cited by examiner

*Primary Examiner* — Steven J Mottola
(74) *Attorney, Agent, or Firm* — Richard T. Ogawa; Ogawa P.C.

(57) ABSTRACT

A variable gain amplifier having stabilized frequency response for widened gain control range. A resistor-capacitor compensation network is provided between two differential current input ports and corresponding emitter nodes of cross-coupled four transistors in the variable gain amplifier to desensitize the gain control voltages to the system noise and provide compensation to the VGA frequency response when the differential gain control voltage varies the gain setting, yielding a substantially stabilized frequency response over a −3 dB bandwidth ranging from 1 GHz to 60 GHz with a widened gain control range up to 12 dB without increasing power consumption.

18 Claims, 2 Drawing Sheets

METHOD FOR IMPROVING STABLE FREQUENCY RESPONSE OF VARIABLE GAIN AMPLIFIER

BACKGROUND OF THE INVENTION

The present invention relates to telecommunication techniques. More particularly, the present invention provides a method of improving broadband variable gain amplifier (VGA) with stable frequency response for different gain settings.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Over the past, high data rate broadband communication has been widely implemented via optical network, in which data signals are carried by laser light that is specifically modulated using various kinds of electro-optic modulators. Through communication systems for transmitting the high-data rate signals, variable gain amplifier (VGA) is widely applied. But designing a VGA whose frequency response changes within a tolerable variation for a large gain range is challenging. Conventional designs usually come with power and/or area penalties for large gain setting. For example, a common approach is to identify the gain range with stable frequency response. If the range is not sufficient, the controlled gain range is extended by cascading another VGA. This increases area and power consumption and reduces the overall frequency response. Alternatively, another approach is to compensate for the frequency response variation once the gain is set to a value that exceeds a determined gain range. With this approach, a frequency dependent stage can compensate for losses, but this increases complexity and/or power consumption.

Therefore, an improved VGA design with stable frequency response for widened gain control range is desired.

BRIEF SUMMARY OF THE INVENTION

The present invention relates to telecommunication device and method. Various embodiments of the present invention provide an improved variable gain amplifier with stable frequency response at different gain settings. More specifically, a method of adding RC compensation on the frequency variation under different gain settings in a single VGA configuration is provided with extended the gain control range. In certain embodiments, the invention is applied for high bandwidth opto-electric data communication, though other applications are possible.

In a specific embodiment, the present invention provides a circuit for stabilizing frequency response of a variable gain amplifier. The circuit includes a portion of a variable gain amplifier (VGA) circuit comprising a first input port, a second input port, a first output port, a second output port, a first control port, a second control port, and at least four transistors in a cross-coupled configuration. In the VGA circuit, collector nodes of a first and third of the four transistors are commonly coupled to the first output port, collector nodes of a second and fourth of the four transistors are commonly coupled to the second output port, base nodes of the first and fourth transistors are commonly coupled to the first control port, base nodes of the second and third transistors are commonly coupled to the second control port. The circuit further includes a resistor-capacitor network including a first resistor-capacitor unit coupled between the first input port in parallel to both emitter nodes of the first transistor and the second transistor and a second resistor-capacitor unit coupled between the second input port in parallel to both emitter nodes of the third transistor and the fourth transistor. In an embodiment, the VGA is configured to receive a differential current input signal provided by a first current input signal at the first input port minus a second current input signal at the second input port and to produce a differential current output signal made by a first current output signal at the first output port outputs minus a second current output signal at the second output port outputs under control by applying a differential control voltage made by a first gain control voltage at the first control port minus a second gain control voltage at the second control port. The VGA provides a gain ratio of the differential current output signal over the differential current input signal as a function of frequency characterized by a substantially stable broadband frequency response maintained for a larger gain control range with stable frequency response compared to the topology without the compensation circuit.

In an alternative embodiment, the present invention provides a method for stabilizing frequency response of a variable gain amplifier. The method includes providing a variable gain amplifier (VGA) circuit including a first input port and a second input port, a first output port, a second output port, a first control port, a second control port, and at least four transistors in a cross-coupled configuration. In the VGA circuit, collector nodes of a first and third of the four transistors are commonly coupled to the first output port, collector nodes of a second and fourth of the four transistors are commonly coupled to the second output port, base nodes of the first and fourth transistors are commonly coupled to the first control port, base nodes of the second and third transistors are commonly coupled to the second control port. Additionally, the method includes inserting a first resistor-capacitor unit between the first input port and two emitter nodes of the first transistor and the second transistor, and a second resistor-capacitor unit between the second input port to two emitter nodes of the third transistor and the fourth transistor. The method further includes receiving a differential current input signal provided by a first current input signal at the first input port minus a second current input signal at the second input port. Furthermore, the method includes producing a differential current output signal made by a first current output signal at the first output port outputs minus a second current output signal at the second output port outputs under control by applying a differential control voltage made by a first gain control voltage at the first control port minus a second gain control voltage at the second control port. Moreover, the method includes generating a gain ratio of the differential current output signal over the differential current input signal as a function of frequency characterized by a substantially stable broadband frequency response maintained for a-larger gain control range with stable frequency response-compared to the topology without the compensation circuit.

The present invention achieves these benefits and others in the context of known variable gain amplifier in electronics and telecommunication applications. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
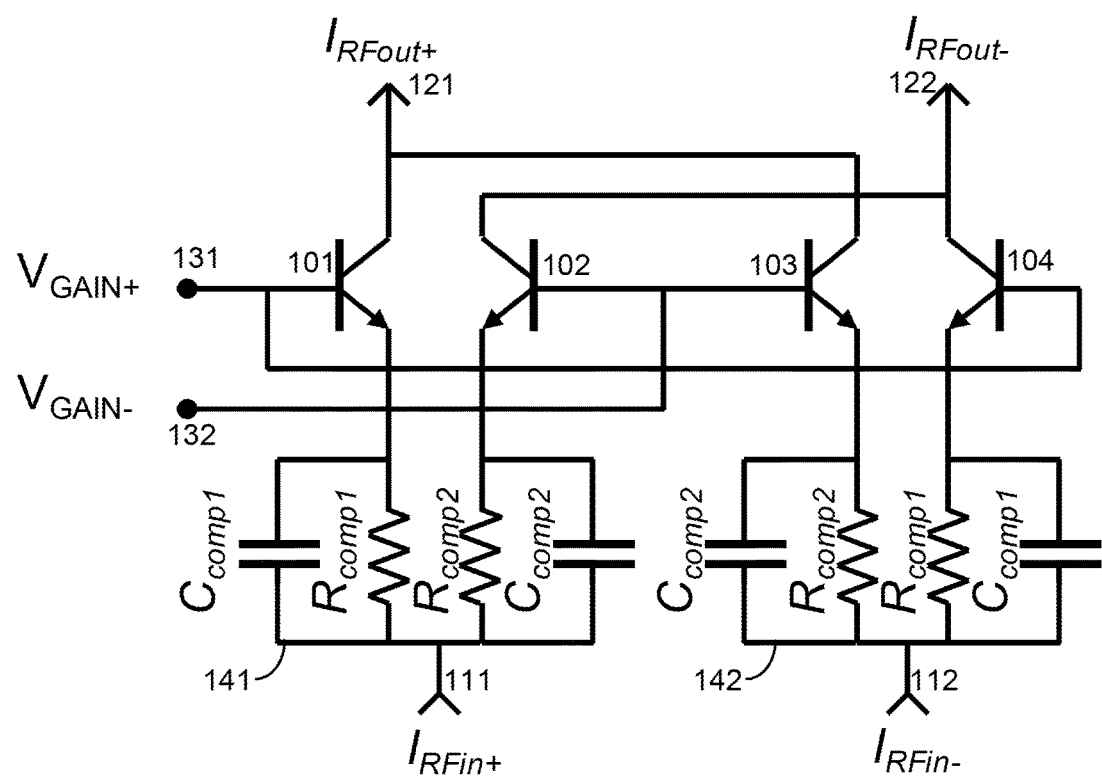
FIG. 1 is a diagram of a portion of variable gain amplifier with a RC compensation network according to an embodiment of the present invention.

The present invention relates to telecommunication device and method. Various embodiments of the present invention provide an improved variable gain amplifier with stable frequency response at different gain settings. More specifically, a method of adding RC compensation on the frequency variation under different gain settings in a single VGA configuration is provided with extended gain control range. In certain embodiments, the invention is applied for high bandwidth opto-electric data communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a circuit diagram of a portion of variable gain amplifier with RC compensation according to an embodiment of the present invention. This diagram is merely an example, which should not unduly limit the scope of the claims herein. One of ordinary skill in the art would recognize many variations, alternatives, and modifications. As shown, a portion of variable gain amplifier (VGA) circuit at least includes four transistors 101, 102, 103, and 104 connected in a typical cross-coupled inverting configuration. A first collector node of the first transistor 101 is connected to a third collector node of the third transistor 103, commonly forming a first output port 121. A second collector node of the second transistor 102 is connected to a collector node of the fourth transistor 104, commonly forming a second output port 122. A first emitter node of the first transistor and a second emitter node of the second transistor are configured to commonly couple with a first input port 111. A third emitter node of the third transistor and a fourth emitter node of the fourth transistor are configured to commonly couple with a second input port 112. The base of the first transistor and the fourth transistor are commonly coupled to a first control node 131. The base of the second transistor and the third transistor are commonly coupled to a second control port 132. Each transistor is a bipolar transistor, though other types of transistors can be used. By design, the first and fourth transistors have the same area (channel length and width) and the second and third transistors have the same area. In an embodiment, the VGA circuit portion includes a RC compensation network 141 (or 142) per each input inserted between one of the two input ports 111 and 112 to corresponding two of four emitter nodes of the four transistors 101, 102, 103, and 104. The input signal for this VGA circuit portion is a differential current signal $I_{RFin+}-I_{RFin-}$, received at the two input ports 111 and 112 to provide a differential output current $I_{RFout+}-I_{RFout-}$ at the two output ports 121 and 122, controlled via the differential gain control voltage $V_{GAIN+}-V_{GAIN-}$ respectively applied at the two control ports 131 and 132.

Typically, a VGA is a voltage controlled electronic amplifier that varies its signal gain depending on a control voltage. The signal can be a current signal or, as seen in above example, a difference of two current signals. A voltage-controlled amplifier normally includes a resistor, which is used to set the amplifier gain. The resistor is disposed in a circuit coupled with a transistor, such as junction bipolar, with a simple bias setting to provide a signal gain. If an analog voltage is used for controlling the VGA, continuous gain control over a wide dynamic range can be achieved. For achieving discrete variable gain levels, a digitally controlled setting using stepped approach giving the circuit graduated increments of gain selection. Either way, one or more resistors are coupled in the VGA input ports so that the gain of the amplifier is then controllable by the current through the voltage control loop.

In an embodiment, each of the two RC compensation networks 141 and 142 is identical. In the first RC compensation network 141, a first resistor-capacitor pair $R_{comp1}$ and $C_{comp1}$ and a second resistor-capacitor pair $R_{comp2}$ and $C_{comp2}$ coupled in parallel from the input port 111 to two emitter nodes of the first transistor 101 and the second transistor 102, respectively. In the second RC compensation network 142, a third resistor-capacitor pair $R_{comp2}$ and $C_{comp2}$ and a fourth resistor-capacitor pair $R_{comp1}$ and $C_{comp1}$ coupled in parallel from the input port 112 to two emitter nodes of the first transistor 103 and the fourth transistor 104, respectively. As illustrated by FIG. 1 in a self-explanatory manner, the first resistor-capacitor pair in the first RC compensation network 141 coupled to the emitter node of the first transistor 101 is identical to the second resistor-capacitor pair in the second RC compensation network 142 coupled to the emitter node of the fourth transistor 104, where the first transistor 101 and the fourth transistor 104 share a common base connected to the first control node 131 coupled to $V_{GIAN+}$. Alternatively, the second resistor-capacitor pair in the first RC compensation network 141 coupled to the emitter node of the second transistor 102 is identical to the first resistor-capacitor pair in the second RC compensation network 142 coupled to the emitter node of the third transistor 103, where the second transistor 102 and the third transistor 103 share another common base connected to the second control node 132 coupled to $V_{GIAN-}$.

The resistors in the RC compensation network are configured to extend the gain control voltage range and desensitize the gain control voltages $V_{GAIN}$ to system noise. Additionally, the capacitors are added for providing compensation to the VGA frequency response when the gain control voltage $V_{GAIN}$ varies the gain setting. The frequency response includes gain flatness, bandwidth, and roll-off characteristics of typical signal profile that is often affected by system noise especially when the gain setting is low. With the RC compensation network, a differential output current signal ($I_{RFout+} - I_{RFout-}$) is compensated to have stable frequency response for different gain settings.

Referring to FIG. 1, the VGA uses cross-coupled differential pairs to have its gain controlled via the differential gain control voltage $V_{GAIN}$ which is very sensitive to the noise. In this configuration, a small noise-induced variation in the control voltage easily changes the gain of the amplifier, transferring the noise directly to the output current signal. By adding the RC compensation network to the input ports, the resistors $R_{comp1}$ and $R_{comp2}$ within the RC network effectively desensitize the $V_{GAIN}$ to the noise by extending the range of the control voltage $V_{GAIN}$. In a specific embodiment, the influence of $R_{comp1}$ and $R_{comp2}$ on the VGA frequency response depends on the gain setting. More detailed descriptions on the influence the resistors on the VGA frequency response can be found below via FIG. 2. In another specific embodiment, the addition of $C_{comp1}$ and $C_{comp2}$ into the RC network instead of using resistors alone provides desired compensation for the VGA frequency response to make it substantially stable for any gain settings. In addition, adding the capacitors does not increase the power consumption of the VGA.

The values of the resistor and the capacitor in each resistor-capacitor pair within each RC compensation network are selected at least based on a ratio of the first/fourth transistors over the second/third transistors in the VGA in terms of internal emitter and base resistances, the transistors bias currents, the gain control range expected for the VGA design, and the frequency range for operating the VGA for various applications.

Figure 2:
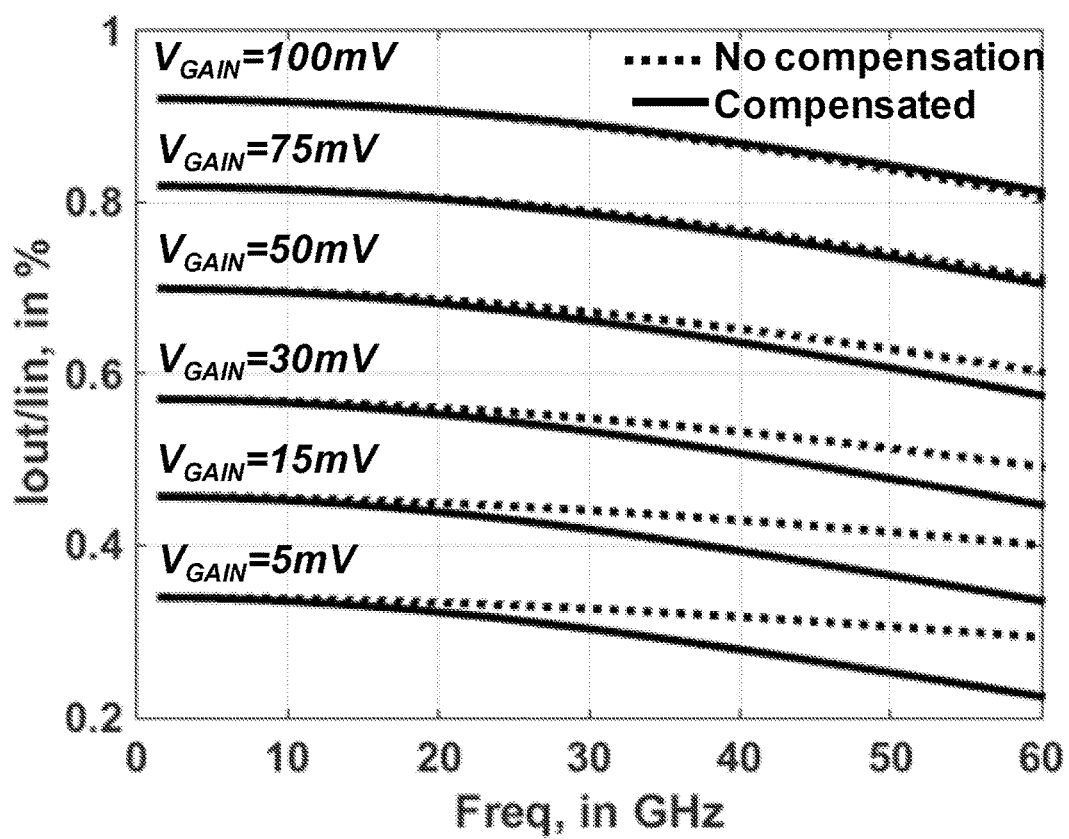
FIG. 2 is a plot showing VGA frequency response for different gain settings with and without RC compensation according to an embodiment of the present invention.

FIG. 2 is a plot showing the VGA frequency response for different gain settings with R only and with RC compensation according to an embodiment of the present invention. This diagram is merely an example, which should not unduly limit the scope of the claims herein. One of ordinary skill in the art would recognize many variations, alternatives, and modifications. As shown, the VGA gain ratio of the differential current signal output over input is plotted against frequency in a broadband range. In a specific embodiment, the frequency range for operating this VGA is from a low frequency point 1 GHz corresponding to a full gain to a maximum frequency point corresponding to a −3 dB gain loss. Additionally, the relationship of differential gain vs frequency is separately plotted for various gain settings represented by different gain control voltages $V_{GAIN}$, respectively for two VGA designs: a conventional one with R-only compensation and the present invention with RC compensation. As shown in FIG. 2, the Note, for simplifying the description, all input current $I_{in}$, output current $I_{out}$, and control voltage signals $V_{GAIN}$ are referred in FIG. 2 using single quantities though they are still differential signals.

For an ideal VGA, the gain ratio $I_{out}/I_{in}$ decreases with increasing frequency from the low frequency point to the maximum frequency point (−3 dB) but maintains a fixed frequency response relationship when $V_{GAIN}$ is changed. In the example shown in FIG. 2, the ideal VGA has $I_{out}/I_{in}$ variation of 0.1075 from 1 GHz to 60 GHz, for any value of $V_{GAIN}$.

The dotted curves are corresponding to the conventional VGA design with resistor only being coupled into the input ports. As shown in FIG. 2, the VGA frequency response changes quite bit when different gain settings are used, especially at higher frequency regions. For example, for $V_{GAIN}=100$ mV, $I_{out}/I_{in}=0.9214$ at 1 GHz; for $V_{GAIN}=50$ mV gives $I_{out}/I_{in}=0.6998$ at 1 GHz, but $I_{out}/I_{in}$ varies 0.0905 from a −3 dB low cutoff frequency 1 GHz to a −3 dB high cutoff frequency 60 GHz, introducing 15.8% gain error compared to the ideal VGA (variation of 0.1075 from 1 GHz to 60 GHz), or 1.85% error with respect to $I_{out}/I_{in}$ at the −3 dB high cutoff frequency 60 GHz comparing to ideal VGA case. The gain control range from 50 mV to 100 mV corresponds to 20 log (0.9214/0.6998)=2.389 dB. In order words, in order to maintain the VGA frequency response substantially stable with less than 2% deviation from the ideal case, the workable gain control range must be limited to less than 2.4 dB.

However, for VGA design with full RC compensation (as shown in FIG. 1), the VGA frequency responses for different gain settings are plotted as solid curves in the FIG. 2. As shown, VGA frequency response now becomes quite stable for much wider gain control range. For example, for $V_{GAIN}=100$ mV, $I_{out}/I_{in}=0.9214$ at −3 dB low cutoff frequency 1 GHz, and for $V_{GAIN}=5$ mV, $I_{out}/I_{in}=0.3397$ at 1 GHz, but $I_{out}/I_{in}=0.2246$ at −3 dB high cutoff frequency 60 GHz, the gain varies 0.1151 from 1 GHz to 60 GHz. Therefore, the new VGA design with RC full compensation introduces 7% percent gain error compared to the variation of 0.1075 from 1 GHz to 60 GHz for ideal VGA. In other words, the VGA $I_{out}/I_{in}$ frequency response with full RC compensation provides only 0.76% error at −3 dB high cutoff frequency 60 GHz comparing to ideal VGA case. For $V_{GAIN}$ ranging from 100 mV to 5 mV, it corresponds to a gain control range of 20 log (0.9214/0.3397)=8.667 dB. In other words, by keeping the VGA frequency response to less than 1%, the workable gain control range is effectively extended to about 9 dB. Additional numerical estimation can be drawn under the same embodiment of the present invention, for maintaining the VGA frequency response to less than 2%, the workable gain control range could be extended to about 12 dB, that is almost 10-dB widening of the gain control range without causing any power consumption increase. Therefore, FIG. 2 demonstrates clearly that using RC network coupled to the input ports of the VGA is able to compensate the gain change due to frequency change for substantially stabilizing the frequency response with a widened gain control range.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A circuit for stabilizing frequency response of a variable gain amplifier, the circuit comprising:
    a portion of a variable gain amplifier (VGA) circuit comprising a first input port and a second input port, a first output port, a second output port, a first control port, a second control port, and at least four transistors in a cross-coupled configuration wherein collector nodes of a first and third of the four transistors are commonly coupled to the first output port, collector nodes of a second and fourth of the four transistors are commonly coupled to the second output port, base nodes of the first and fourth transistors are commonly coupled to the first control port, base nodes of the second and third transistors are commonly coupled to the second control port;
    a resistor-capacitor network comprising a first resistor-capacitor unit coupled between the first input port in parallel to both emitter nodes of the first transistor and the second transistor, a second resistor-capacitor unit coupled between the second input port in parallel to both emitter nodes of the third transistor and the fourth transistor;
    wherein the VGA is configured to receive a differential current input signal provided by a first current input signal at the first input port minus a second current input signal at the second input port and to produce a differential current output signal made by a first current output signal at the first output port outputs minus a second current output signal at the second output port outputs under control by applying a differential control voltage made by a first gain control voltage at the first control port minus a second gain control voltage at the second control port, thereby yielding a gain ratio of the differential current output signal over the differential current input signal as a function of frequency characterized by a substantially stable broadband frequency response maintained for widened 12 dB gain control range of the differential control voltage, and
    wherein the first resistor-capacitor unit is substantially identical to the second resistor-capacitor unit, each comprising two resistor-capacitor pairs, each resistor-capacitor pair being connected in parallel between the input port and at least one emitter node of the four transistors.

2. The circuit of claim 1 wherein each of the four transistors is a bipolar transistor, wherein the first and fourth transistors have a same area and the second and third transistors have a same area.

3. The circuit of claim 1 wherein the resistor-capacitor pair connected to the first/second transistor is substantially identical to the resistor capacitor pair connected to the fourth/third transistor commonly shared with the first/second gain control voltage.

4. The circuit of claim 3 wherein the values of the resistor and the capacitor in each resistor-capacitor pair are selected at least based on a ratio of the first/fourth transistors over the second/third transistors in terms of internal emitter and base resistances, transistors bias currents, the gain control range, and the frequency.

5. The circuit of claim 1 wherein the differential control voltage is provided in a gain control range over 9 dB from 5 mV to 100 mV within which the broadband frequency response of the gain ratio is maintained in a substantially stable relationship with less than 1% error.

6. The circuit of claim 1 wherein the differential control voltage is provided in a gain control range over 12 dB within which the broadband frequency response of the gain ratio is maintained in a substantially stable relationship with less than less than 2% error.

7. The circuit of claim 1 wherein the broadband frequency response comprises a bandwidth ranging from a −3 dB low cutoff frequency to a −3 dB high cutoff frequency.

8. The circuit of claim 7 wherein the −3 dB low cutoff frequency comprises 1 GHz.

9. The circuit of claim 7 wherein the −3 dB high cutoff frequency comprises 60 GHz or lower.

10. A method for stabilizing frequency response of a variable gain amplifier, the method comprising:
    providing a variable gain amplifier (VGA) circuit comprising a first input port and a second input port, a first output port, a second output port, a first control port, a second control port, and at least four transistors in a cross-coupled configuration wherein collector nodes of a first and third of the four transistors are commonly coupled to the first output port, collector nodes of a second and fourth of the four transistors are commonly coupled to the second output port, base nodes of the first and fourth transistors are commonly coupled to the first control port, base nodes of the second and third transistors are commonly coupled to the second control port;
    inserting a first resistor-capacitor unit between the first input port and two emitter nodes of the first transistor and the second transistor, and a second resistor-capacitor unit between the second input port to two emitter nodes of the third transistor and the fourth transistor;
    receiving a differential current input signal provided by a first current input signal at the first input port minus a second current input signal at the second input port;
    producing a differential current output signal made by a first current output signal at the first output port outputs minus a second current output signal at the second output port outputs under control by applying a differential control voltage made by a first gain control voltage at the first control port minus a second gain control voltage at the second control port; and
    generating a gain ratio of the differential current output signal over the differential current input signal as a function of frequency characterized by a substantially stable broadband frequency response maintained for widened 12 dB gain control range of the differential control voltage,
    wherein the first resistor-capacitor unit is substantially identical to the second resistor-capacitor unit, each comprising two resistor-capacitor pairs, each resistor-capacitor pair being connected in parallel between the input port and at least one emitter node of the four transistors.

11. The method of claim 10 wherein each of the four transistors is a bipolar transistor, wherein the first and fourth transistors have a same area and the second and third transistors have a same area.

12. The method of claim 10 wherein the resistor-capacitor pair connected to the first/second transistor is substantially identical to the resistor capacitor pair connected to the fourth/third transistor commonly shared with the first/second gain control voltage.

13. The method of claim 12 wherein the values of the resistor and the capacitor in each resistor-capacitor pair are selected at least based on a ratio of the first/fourth transistors over the second/third transistors in terms of internal emitter and base resistances, transistors bias currents, the gain control range, and the frequency.

14. The method of claim 10 wherein the differential control voltage is provided in a gain control range about 9 dB from 5 mV to 100 mV within which the broadband frequency response of the gain ratio is maintained in a substantially stable relationship with less than 1% error.

15. The method of claim 10 wherein the differential control voltage is provided in a gain control range over 12 dB within which the broadband frequency response of the gain ratio is maintained in a substantially stable relationship with less than 2% error.

16. The method of claim 10 wherein the broadband frequency response comprises a bandwidth ranging from a −3 dB low cutoff frequency to a −3 dB high cutoff frequency.

17. The method of claim 16 wherein the −3 dB low cutoff frequency comprises 1 GHz.

18. The method of claim 16 wherein the −3 dB high cutoff frequency comprises 60 GHz or lower.

* * * * *